United States Patent
Mukherjee

(10) Patent No.: US 9,755,309 B2
(45) Date of Patent: Sep. 5, 2017

(54) RESONANT COMPENSATING LOOP FOR SHIELDING OF METAL FOR MAGNETICALLY COUPLED NFC AND/OR RFID DEVICES, AND METHODS OF MAKING AND USING THE SAME

(71) Applicant: Somnath Mukherjee, Milpitas, CA (US)

(72) Inventor: Somnath Mukherjee, Milpitas, CA (US)

(73) Assignee: Thin Film Electronics ASA, Oslo (NO)

( * ) Notice: Subject to any disclaimer, the term of this patent is extended or adjusted under 35 U.S.C. 154(b) by 96 days.

(21) Appl. No.: 14/579,751

(22) Filed: Dec. 22, 2014

(65) Prior Publication Data
US 2016/0181695 A1    Jun. 23, 2016

(51) Int. Cl.
*G06K 19/06* (2006.01)
*H01Q 7/00* (2006.01)
(Continued)

(52) U.S. Cl.
CPC ............ *H01Q 7/00* (2013.01); *H01Q 1/2216* (2013.01); *H01L 22/12* (2013.01)

(58) Field of Classification Search
CPC .......... H01Q 7/00; H01Q 1/2225; H01Q 1/38; H01Q 1/22; H01Q 1/2216; H01Q 1/2283; G06K 19/07794; G06K 19/07722; G06K 19/07749; G06K 19/07769; A61B 5/0031; A61B 5/6867
(Continued)

(56) References Cited

U.S. PATENT DOCUMENTS

2003/0174099 A1* 9/2003 Bauer .................. G06K 7/0008
343/893
2005/0212707 A1* 9/2005 Egbert ............. G06K 19/07749
343/702
(Continued)

OTHER PUBLICATIONS

Wang-Sang Lee, Hyeong-Seok Jang, Kyoung-Sub Oh and Jong-Won Yu; "Close Proximity Effects of Metallic Environments on the Antiparallel Resonant Coil for Near-Field Powering"; IEEE Transactions on Antennas and Propagation; Jun. 2013; 4 pgs.; vol. 61, No. 6.
(Continued)

*Primary Examiner* — Thien M Le
(74) *Attorney, Agent, or Firm* — Andrew D. Fortney; Central California IP Group, P.C.

(57) ABSTRACT

A near field communication device, and methods of manufacturing and using the same. The near field communication device includes a receiver configured to convert a received near field signal to an electric signal, a transmitter configured to generate a transmittable near field signal, a dielectric substrate within a housing, an antenna on the dielectric substrate, and a compensating loop within the housing and coupled to the antenna. The antenna is configured to receive the received near field signal and to transmit or broadcast the transmittable near field signal. The compensating loop is electromagnetically coupled to the antenna and advantageously mitigates or counteracts an electromagnetic effect of metal on or near a surface of the dielectric substrate opposite from the antenna.

31 Claims, 12 Drawing Sheets

(51) Int. Cl.
*H01Q 1/22* (2006.01)
*H01L 21/66* (2006.01)

(58) Field of Classification Search
USPC .......................................... 235/492, 488, 380
See application file for complete search history.

(56) References Cited

U.S. PATENT DOCUMENTS

| | | | | |
|---|---|---|---|---|
| 2009/0079268 | A1* | 3/2009 | Cook | H01Q 1/248 307/104 |
| 2010/0231482 | A1* | 9/2010 | Yoshida | G06K 19/07749 343/904 |
| 2013/0120208 | A1* | 5/2013 | Kaikkonen | H01Q 1/243 343/803 |
| 2013/0207853 | A1* | 8/2013 | Yamamoto | H01Q 1/002 343/702 |
| 2013/0272652 | A1* | 10/2013 | Yaacobi | G02B 6/264 385/27 |

OTHER PUBLICATIONS

Fredy Segura-Quijano, Jesus Garcia-Canton, Jordi Sacristan, Teresa Oses and Antonio Baldi; "Wireless Powering of Single-Chip Systems With Integrated Coil and External Wire-Loop Resonator"; Applied Physics Letters 92; 2008; 3 pgs.; 074102-1; American Institute of Physics.

Sungtek Kahng; "Enhanced Coupling Structures for Wireless Power Transfer Using the Circuit Approach and the Effective Medium Constants (Metamaterials)"; 2012; 17 pgs.; Wireless Power Transfer—Principles and Engineering Explorations, Dr. Ki Young Kim (Ed.), ISBN: 978-953-307-874-8; InTech.

Michael Gebhart et al.; "Design of 13.56 MHz Smartcard Stickers With Ferrite for Payment and Authentication"; 6 pages; NXP Semiconductors, Gratkom, Austria and Hamburg, Germany.

* cited by examiner

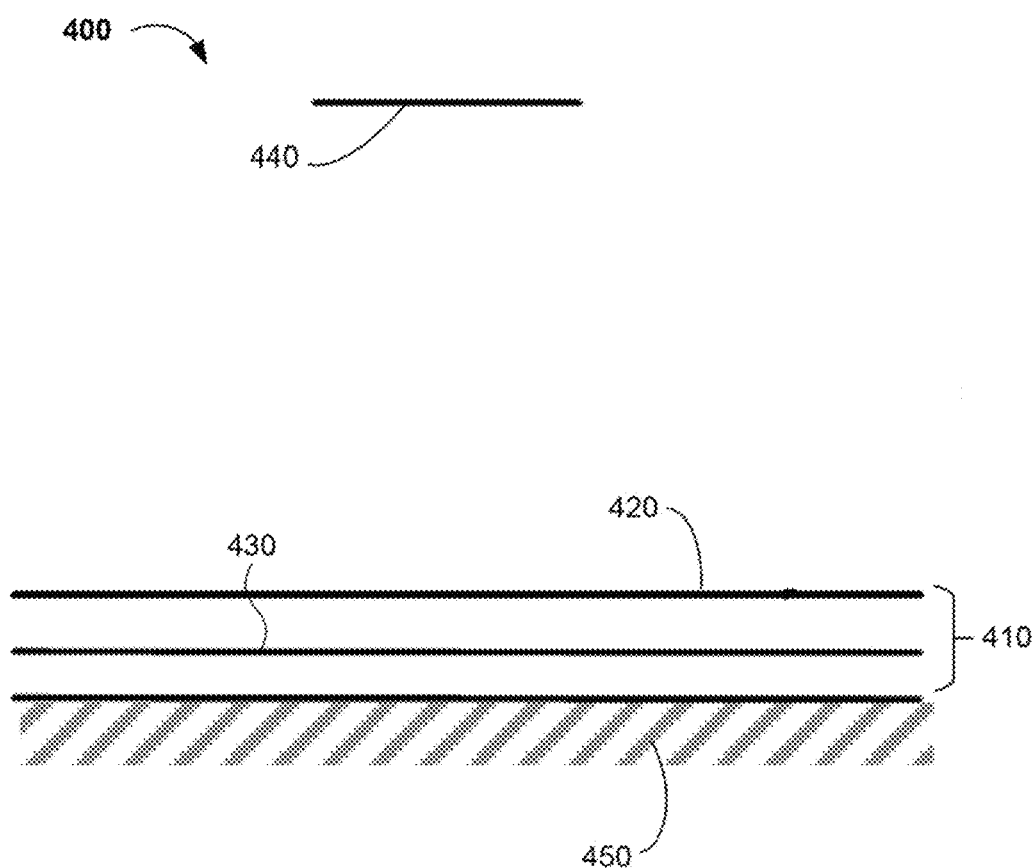

FIG. 13A
FIG. 13B
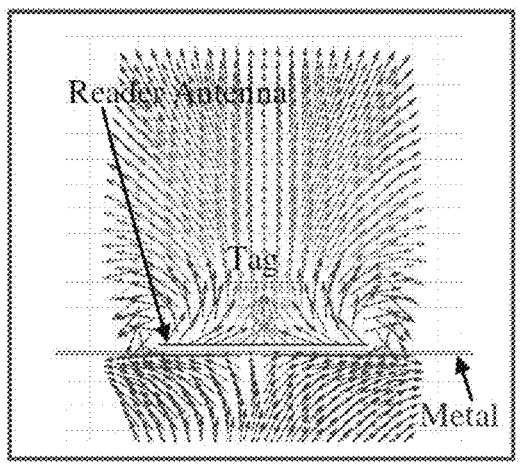
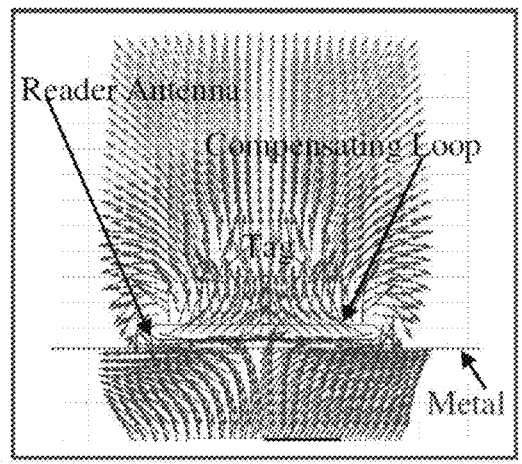
FIG. 14
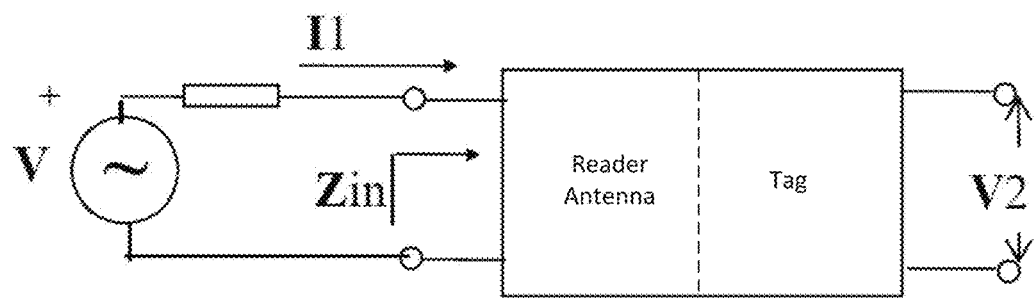

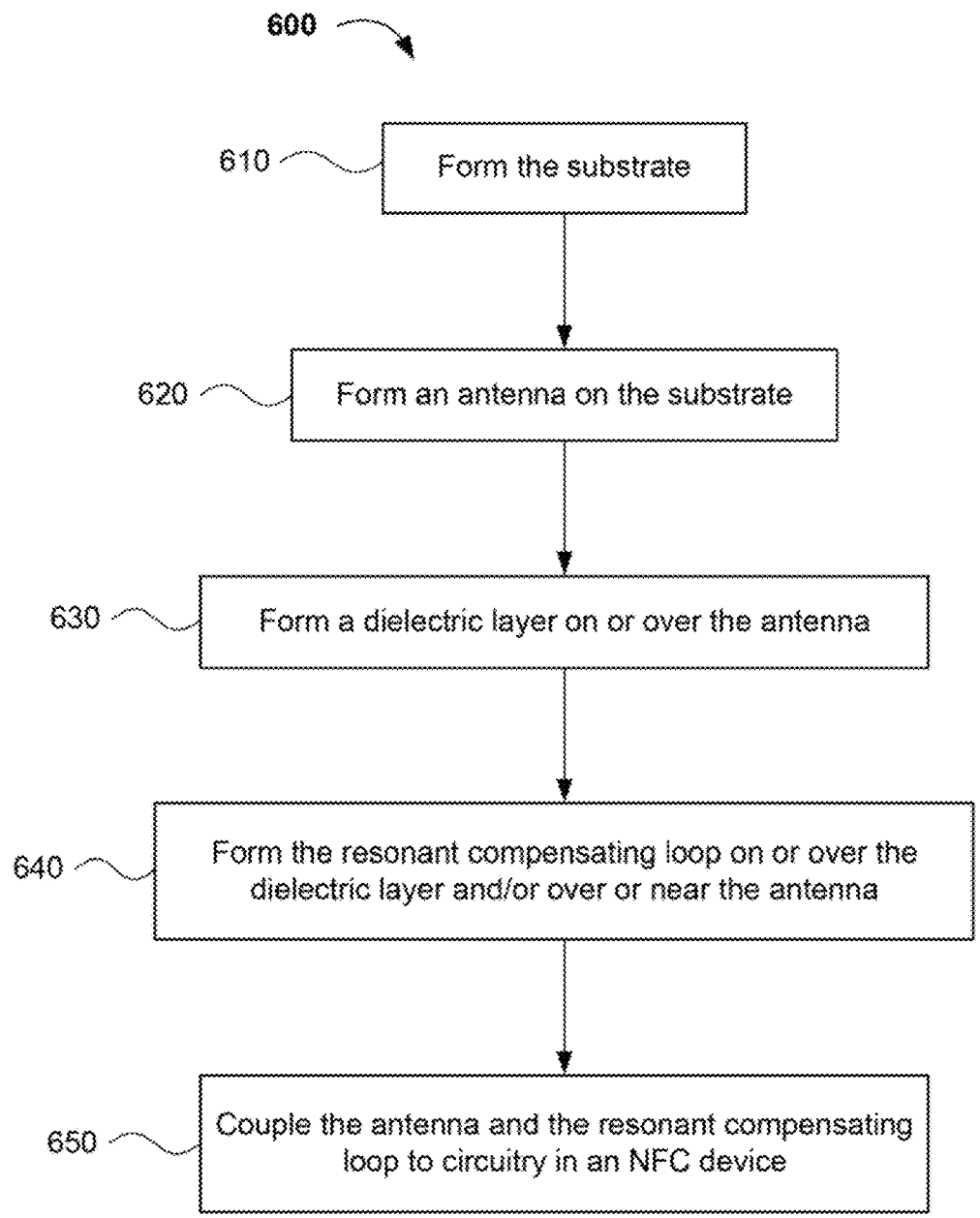

RESONANT COMPENSATING LOOP FOR SHIELDING OF METAL FOR MAGNETICALLY COUPLED NFC AND/OR RFID DEVICES, AND METHODS OF MAKING AND USING THE SAME

FIELD OF THE INVENTION

The present invention generally relates to the field of near field communication. More specifically, embodiments of the present invention pertain to radio frequency (RF) and/or RF identification (RFID) tags and devices with a resonant complementary loop, and methods of manufacturing and using the same.

DISCUSSION OF THE BACKGROUND

RFID tags and readers that communicate using magnetic coupling or magnetically coupled transponders (e.g., according near field communication [NFC], ISO 14443 Proximity Smart Card, or ISO 15693 Vicinity Smart Card standards operating at 13.56 MHz, or variations thereof) perform well in the presence of most liquids. However, signal transmissions to and/or from such RFID tags generally degrade in the presence of metal.

Generally, in tag and reader applications, the tag is sometimes attached to an article that is on or in close proximity to a metallic surface. Although ferrite shielding may be effective in counteracting the effect of nearby metal objects on tags, ferrite shielding is relatively expensive, especially for relatively large antennas. Presently, there is intense pressure in the market to develop high volume, functionally reliable RF and NFC devices such as tags and readers at a relatively low cost. Mobile phones in 'tag emulation' mode work as tags. The NFC antenna inside the mobile phone may be positioned relatively close to metallic objects because of space constraints.

Alternatively, a gap (e.g., a spacer of non-conducting and/or non-magnetic material) may be positioned between the metal surface and the tag. However, spacers are not often desirable, available or permitted, due to space constraints.

Similar problems occur with reader antennas, such as antennas mounted on metallic shelves (e.g., "smart shelves") used for automated inventory tracking. Referring to FIG. 1, an arrangement 10 for conventional automated inventory tracking with smart shelf technology is illustrated. Typically, high frequency (HF) systems provide better locational precision than ultra-high frequency (UHF) in "smart shelf" systems. However, a HF reader antenna 20 positioned on a metal shelf 30 requires spacers (not shown), which waste space and are inconvenient. Mobile phones in reader mode work as readers. The NFC antenna inside the mobile phone may be positioned relatively close to metallic objects because of space constraints.

Generally, mobile devices such as smart phones, tablet computers, and pad computers can act as either a tag or reader, and antennas in such mobile devices are subject to the same effect of nearby metal on tag/reader antennas, but this effect is exacerbated by the fact the antenna is constrained in a relatively small space or area.

Various alternatives to expensive ferrite based solutions exist. However, they are generally not practical and/or desirable. For example, perforated metal sheets may be an integral part of reader antennas, but may be relatively expensive and challenging to design and implement. Alternatively, anti-parallel loops may demonstrate improved performance in wireless power transmission (WPT) compared to conventional coils in the presence of or proximity of metals. However, this approach may require an impractical number of coil turns.

Extraneous objects (e.g., metal) in WPT may be treated as an impedance mismatch issue, and improvements in transmission efficiency (e.g., power gain) may be demonstrated by proper matching. However, the mechanism to achieve such impedance matching using this approach is not well understood.

FIG. 2 shows surface currents (e.g. eddy currents) 50 on a metal sheet 60 with an antenna 70 thereon. Generally, a magnetic field generated by such eddy currents 50 opposes an excitation field (e.g., which may be generated by the antenna 70). The total flux linked by the coil in antenna 70 thus decreases in such an environment. As a result, inductance decreases, and the resonant frequency of the antenna 70 increases (i.e. mistuning). Consequently, flux linked by a secondary loop (not shown), such as that in a corresponding device (e.g., a tag), decreases, resulting in performance degradation, such as deterioration in power and signal transfer.

When an electromagnetic surface, such as an electrically conducting sheet having a relatively low impedance, is placed in the vicinity of a loop containing current (e.g., a reader antenna), eddy currents are generated (e.g., as shown in FIG. 2). As a result, a magnetic field is generated in opposition to the original field, thereby reducing the flux through the loop. Reduction of flux, and therefore inductance, results in an increase of the resonant frequency. Furthermore, reduction of the effective magnetic field reduces power transfer to a load that is connected to a second loop magnetically coupled with the first loop. Thus, a degradation of the performance is observed for magnetically coupled reader-tag systems in the presence of metal.

The phenomenon of surface (eddy) currents can be studied using surface waves, whereby a surface impedance ($Z_s$) can be defined by the following equation:

$$Z_s = \frac{1+j}{\sigma \delta} \tag{1}$$

where $\sigma$ is the conductivity, $\delta$ is the skin depth of the metal, and $j^2$ equals $-1$. The surface impedance is analogous to sheet resistance, and therefore an estimate of the impedance around a closed loop may be made using the principle of determining the resistance of a loop by dividing it into a number of squares of known dimensions (e.g., one of which may be skin depth of the metal $\delta$).

FIG. 3 shows surface (eddy) currents on the metal sheet and illustrates a principle by which impedance of the sheet 60 can be estimated using squares a1, a2, a3, etc., along the closed loop direction of a current loop of squares (not drawn to scale, for illustration only). The sheet 60 is divided into are array of squares, from which concentric loops are designated. The total impedance of a given loop is $Z_s \cdot N1$, where N1 is equal to the length of the loop/$\delta$. Another concentric loop (e.g., outside the first concentric loop) is denoted by adjacent squares b1, b2, b3, etc.

FIG. 4 shows an equivalent circuit model 100 for a conventional near field communication device in the presence of metal. The reader equivalent circuit 110 includes resistances R0 and R1, capacitance C1, and an inductance L, excited by a voltage V which drives a current I1 through the loop. The equivalent circuit 120 for the metal sheet (e.g., sheet 60 in FIG. 3) includes coupled inductance L3 and resistance R3. A voltage induced in inductance L3 due to the magnetic field generated in L generates a current I3 in the circuit 120. Input voltage (V) can be expressed by the following equation:

$$V = [R1 + R0 + j(\omega L1 - 1/\omega C1)] \cdot I1 - j\omega M13 \cdot I3 \qquad (2)$$

in which $0 = [R3 + jR3] \cdot I3 - j\omega M13 \cdot I1$, and the current (I3) is calculated by the following equation:

$$I3 = \frac{1+j}{2} \cdot \frac{\omega M13}{R3} I1 \qquad (3)$$

FIG. 5 illustrates the mechanism of shielding using ferrite by changing the direction of magnetic flux density B towards the metal sheet 60 in the presence of a ferrite shield 150. However, ferrite shields generally add cost to the use of tags, and can introduce implementation issues in some cases. Therefore, a low cost solution is necessary to counteract and/or mitigate the effect of metal on or in proximity of magnetically coupled near field communication devices.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY OF THE INVENTION

The present invention relates to radio frequency (RF) and/or RF identification (RFID) tags and devices with a resonant compensating loop, and methods of manufacturing and using the same.

In one aspect, the present invention relates to a near field communication device, comprising a receiver (e.g., demodulator) configured to convert a received near field signal to an electric signal, a transmitter (e.g., modulator) configured to generate a transmittable near field signal, a dielectric substrate within a housing, an antenna on the dielectric substrate, and a compensating loop (e.g., a resonant compensating loop) within the housing and coupled to the antenna. The antenna receives the received near field signal and transmits or broadcasts the transmittable near field signal. The antenna may be between the dielectric substrate and the compensating loop. Alternatively, the compensating loop may be between the dielectric substrate and the antenna. The compensating loop advantageously mitigates the deleterious effect of metal objects in proximity of magnetically coupled readers and/or transponders. In effect, the compensating loop robs or removes energy from the metal.

In various embodiments of the present invention, the compensating loop comprises a metal layer, which may be planar (e.g., a metal sheet), ring-shaped, or another geometrical shape. In further aspects, the antenna and compensating loop may each comprise an electrically conducting coil or a plurality of loops of conductive material (e.g., copper, aluminum, titanium, stainless steel or other alloy, etc.). The compensating loop is generally magnetically or inductively coupled to the antenna, and can mitigate or counteract an electromagnetic effect of one or more metal objects on or near a surface of the dielectric substrate opposite from the antenna.

In some embodiments of the present invention, the antenna and the resonant compensating loop may have the same or similar size and/or number of turns and/or loops. The antenna and the resonant compensating loop may be a predetermined distance apart. As the distance between the antenna and the resonant compensating loop increases, the performance of the compensating loop may improve.

In other or additional embodiments of the present invention, the present near field communication device may further comprise an insulating or dielectric layer between the antenna and the compensating loop. The insulating or dielectric layer may have a thickness of 1-25 mm, and may comprise or consist of air, fiberglass/epoxy, silicon dioxide, silicon nitride, silicon oxynitride, aluminum oxide, tantalum oxide, zirconium oxide, a polysiloxane, parylene, polyethylene, polypropylene, an undoped polyimide, a polycarbonate, a polyamide, a polyether, a copolymer or fluorinated derivative thereof, or a combination thereof.

In further embodiments of the present invention, the dielectric substrate may have a thickness of 1-5 mm. The dielectric substrate may comprise or consist of fiberglass/epoxy, silicon dioxide, silicon nitride, silicon oxynitride, aluminum oxide, tantalum oxide, zirconium oxide, a polysiloxane, parylene, polyethylene, polypropylene, an undoped polyimide, a polycarbonate, a polyamide, a polyether, a copolymer or fluorinated derivative thereof, or a combination thereof.

In another aspect, the present invention relates to a method of manufacturing a near field communication device, comprising forming an antenna on a dielectric substrate, the antenna receiving a first near field signal and transmitting or broadcasting a second near field signal, and coupled to a receiver (e.g., demodulator) and a transmitter (e.g., modulator), and forming a compensating loop (e.g., a resonant compensating loop) that (i) is electromagnetically coupled to the antenna and (ii) mitigates or counteracts an electromagnetic effect of metal on or near a surface of the dielectric substrate. The antenna, the dielectric substrate and the compensating loop are formed or placed in a housing of the near field communication device. The antenna may be between the dielectric substrate and the compensating loop. Alternatively, the compensating loop may be between the dielectric substrate and the antenna.

In some embodiments of the present method, forming the antenna may comprise depositing a metal layer on the surface of the dielectric substrate, then subsequently patterning and/or etching the metal layer. Alternatively, the antenna may be formed by printing a metal coil or ring on the dielectric substrate. The antenna may have a thickness of 0.01-2 mm.

In other embodiments of the present method, a dielectric layer may be formed on the antenna, before forming the compensating loop. The method may further include forming the substrate (e.g., by injection molding, when the substrate comprises a plastic).

In various embodiments of the present method, forming the compensating loop may comprise depositing a second metal layer on the dielectric layer, then patterning and/or etching the second metal layer. The compensating loop may be formed in a sheet or ring pattern. Alternatively, the compensating loop may be formed on a polyester (PET) layer and/or further include a picofarad (pF) capacitor. Forming the compensating loop includes printing a metal coil or ring (e.g., a copper coil or ring) on the dielectric layer. The compensating loop is magnetically or inductively coupled to the antenna.

Alternatively, forming the compensating loop may comprise depositing a first metal layer on or over the dielectric substrate, then patterning and/or etching the first metal layer. Forming the compensating loop may comprise printing a metal coil or ring on the dielectric substrate. A dielectric layer may be formed on the compensating loop before the antenna is formed. Forming the antenna may comprise depositing a second metal layer on the dielectric layer, then patterning and etching the second metal layer, or printing a metal coil or ring on the dielectric layer.

The present invention provides a device that advantageously uses a compensating loop (e.g., that resonates at a frequency close to the resonant frequency of the antenna or that compensates for the effect of one or more metal objects near the antenna) at a fraction of the cost of a ferrite shield or other similar material. The compensating loop advantageously mitigates the deleterious effect of metal in proximity to magnetically coupled readers and/or transponders (e.g., that "robs" or remove energy from the metal). The present invention further provides a method for mitigating the effect of metal by using a resonant compensating loop in magnetically coupled reader-transponder systems. In addition, the present invention advantageously provides a loop resonant at a frequency close to an operating frequency that reduces the effect(s) of surface currents (e.g., eddy currents) from the metal surface, thereby mitigating the flux reduction due to surface currents on nearby and/or adjacent metal. Furthermore, the direction of the current in the resonant compensating loop is such that it aids the flux generated by the antenna. As a result, the present invention advantageously lowers the manufacturing cost of the tag and/or reader compared to ferrite based shielding.

As a result, the present invention may improve the performance of near field communication devices. The novel devices may have improved efficiency relative to existing NFC devices, and thus reduced cost and materials in comparison to existing RFID tag technologies. These and other advantages of the present invention will become readily apparent from the detailed description of various embodiments below.

BRIEF DESCRIPTION OF THE DRAWINGS

FIG. 9 shows a cross-section of another exemplary near field communication device according to the present invention.

FIGS. 12A-13B depict a peak surface current density and a peak magnetic field, respectively, without the resonant compensating loop (FIGS. 12A and 13A) and with the resonant compensating loop (FIGS. 12B and 13B).

FIG. 14 shows the equivalent two-port network to describe power gain (loss) in an exemplary reader-tag system according to the present invention.

FIG. 20 is a flow chart illustrating an exemplary method of making the present NFC or similar device.

DETAILED DESCRIPTION

Figure 1:
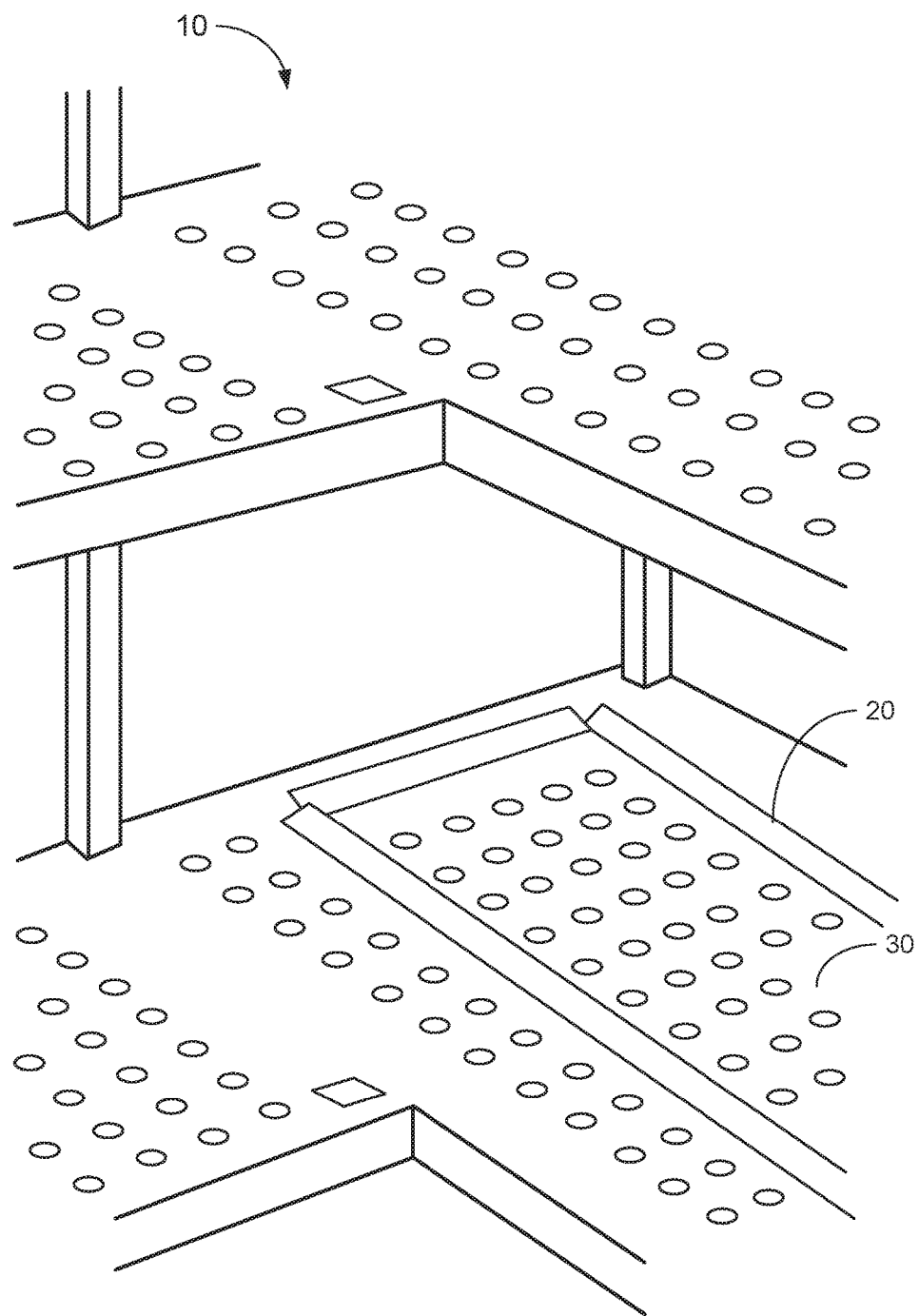
FIG. 1 shows a conventional automated inventory tracking system using smart shelf technology.
Figure 2:
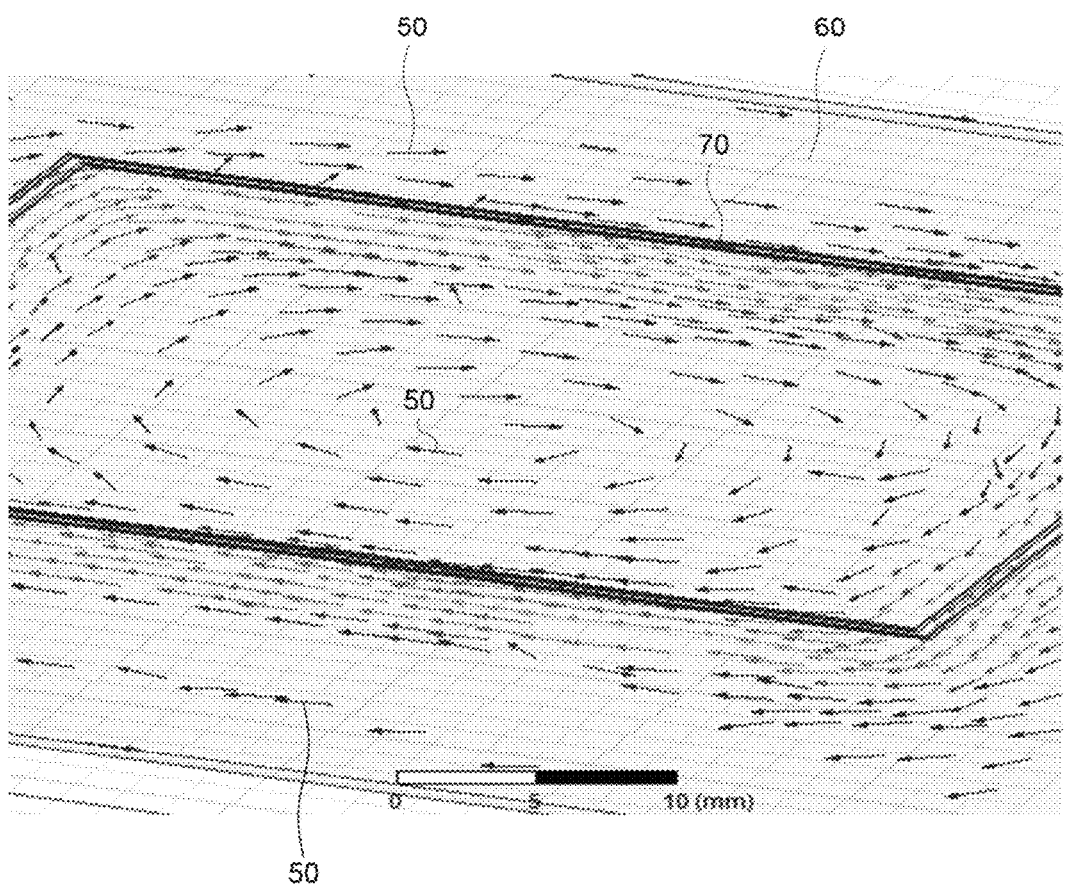
FIG. 2 shows a conventional tag/reader antenna coil on or near a metal sheet.

Reference will now be made in detail to various embodiments of the invention, examples of which are illustrated in the accompanying drawings. While the invention will be described in conjunction with the following embodiments, it will be understood that the descriptions are not intended to limit the invention to these embodiments. On the contrary, the invention is intended to cover alternatives, modifications and equivalents that may be included within the spirit and scope of the invention. Furthermore, in the following detailed description, numerous specific details are set forth in order to provide a thorough understanding of the present invention. However, it will be readily apparent to one skilled in the art that the present invention may be practiced without these specific details. In other instances, well-known methods, procedures, components, and materials have not been described in detail so as not to unnecessarily obscure aspects of the present invention.

The technical proposal(s) of embodiments of the present invention will be fully and clearly described in conjunction with the drawings in the following embodiments. It will be understood that the descriptions are not intended to limit the invention to these embodiments. Based on the described embodiments of the present invention, other embodiments can be obtained by one skilled in the art without creative contribution and are in the scope of legal protection given to the present invention.

Furthermore, all characteristics, measures or processes disclosed in this document, except characteristics and/or processes that are mutually exclusive, can be combined in any manner and in any combination possible. Any characteristic disclosed in the present specification, claims, Abstract and Figures can be replaced by other equivalent characteristics or characteristics with similar objectives, purposes and/or functions, unless specified otherwise.

Embodiments of the present invention relate to a near field communication device, and methods of making and using the same. The present device provides a resonant compensating loop that advantageously mitigates the effects of the proximity of metal objects to magnetically coupled transponders. Furthermore, the present invention advantageously lowers manufacturing costs compared to systems using conventional ferrite based shielding.

Exemplary NFC Devices(s)

The present invention relates to a near field communication device, comprising a receiver (e.g., demodulator) configured to convert a first near field signal to an electric signal, a transmitter (e.g., modulator) configured to generate a second near field signal, a dielectric substrate, an antenna on the dielectric substrate, and a resonant compensating loop magnetically coupled to the antenna. The antenna receives the first near field signal, transmits or broadcasts the second near field signal, and is located generally between the dielectric substrate and the resonant compensating loop. The resonant compensating loop advantageously mitigates the deleterious effect of metal (e.g., one or more metal objects) in proximity of magnetically coupled readers and/or transponders that employ the present invention. In effect, the compensating loop "robs" or removes electromagnetic energy from the metal.

Figure 6:
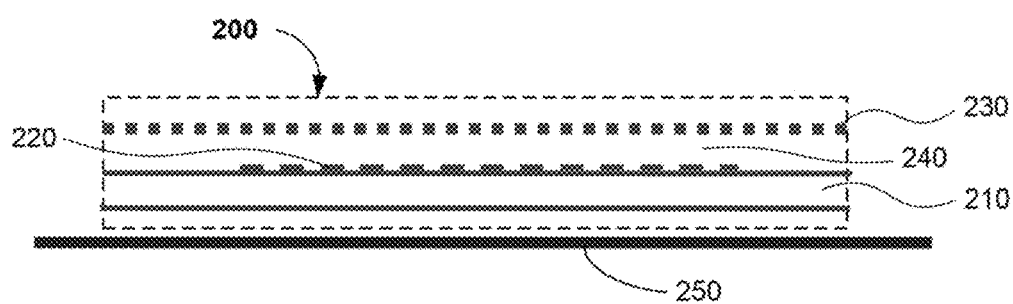
FIG. 6 is a cross-section of an exemplary near field communication device according to the present invention.

FIG. 6 shows an exemplary near field communication (NFC) device 200 according to the present invention. The device 200 generally comprises an antenna 220 on a dielectric substrate 210 and coupled to circuitry configured to receive and process a signal received and/or broadcast by the antenna 220. Based on the design of the device 200 and the system, the antenna may be close to a metal shelf or other object 250. A resonant compensating loop 230 mounted on the antenna alleviates the effect of the metal object 250. This type of configuration may be used for both tag and reader applications. The present invention advantageously demonstrates the efficacy of a compensating loop 230 to counteract the effect of surface currents in a nearby metal object 250.

Figure 7:
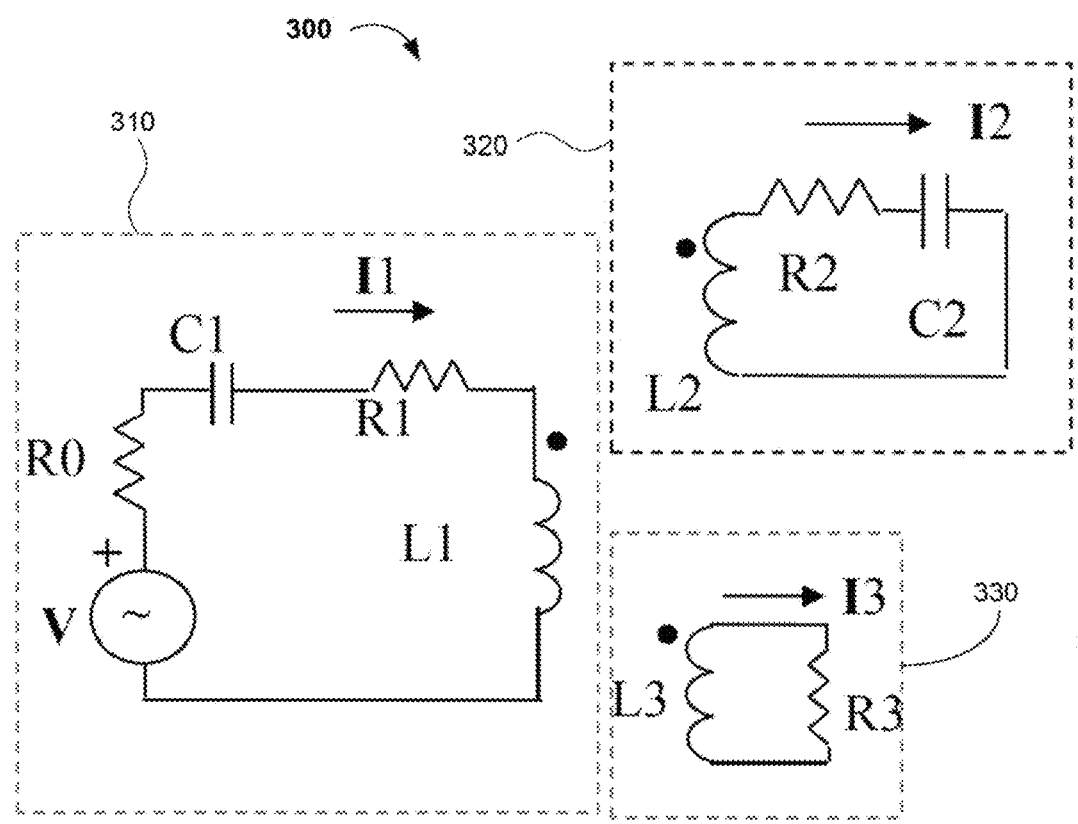
FIG. 7 is diagram showing equivalent circuits for an exemplary near field communication device according to the present invention in proximity to a metal object.

The design of the NFC device 200 is advantageously determined using estimations of certain parameters of the metal object (shelf or sheet), an antenna, and compensating loop. As discussed above, the total impedance of a first loop in the metal shelf 250 is $Z_s \cdot N1$. Similarly, a second loop in the shelf 250 will have an impedance $Z_s \cdot N2$. The second loop is in parallel with the first loop. For all other loops, the metal in the loop can be represented by an equivalent impedance $R(1+j)$, where R is a real number (330 in FIG. 7). Therefore, the metal surface 250 generally presents a resistance, and an equal amount of inductive reactance. At the frequencies of interest, sizes of the antennas are generally small compared to the wavelength, and therefore lumped element equivalent circuits representing the reader/tag 310, the metal object 330 and the resonant compensating loop 320, as shown in FIG. 7 are applicable.

In equivalent circuit 310 (FIG. 7), R1 and L1 represent the reader antenna with an external capacitor C1, driven by a sinusoidal voltage source (V) with angular frequency $\omega$. In equivalent circuit 320, L2, C2 and R2 represent the resonant compensating loop, which counteracts the effect of the metal object. $Z_i$ is the self-impedance of the i-th loop, and $Mi_k$ is the mutual impedance between loops i and k, where (i, k) is (1, 3).

A straightforward linear analysis yields the following equation:

$$I3/I2=(Z2-j\omega M23[M12/M13])/(Z3-j\omega M23[M13/M12])\cdot M12/M13 \quad (4)$$

For an ideal case of M23=0, at resonance, $\omega L2=1/\omega C2$, and equation (4) simplifies to the following equation:

$$I3/I2=(R2/R3[1+j])(M12/M13) \quad (5)$$

The surface (eddy) current in the metal, compared to that in the resonant compensating loop, can therefore be reduced by making R2/R3 small. Comparing currents in the metal with compensating loop (I3) and without the resonant compensating loop (I30), in the ideal case of M23=0, the following equations are obtained:

$$I30/I3 = 1 + (Z3/Z2)(\omega^2 M12^2)/(\omega^2 M13^2 + Z1 \cdot Z3) \quad (6.1)$$

or $$\frac{I30}{I3} = 1 + \frac{1}{R2} \cdot \frac{\omega^2 M12^2}{Z1 + \frac{\omega^2 M13^2}{R3(1+j)}} \quad (6.2)$$

where the presence of the resonant compensating loop reduces the surface (eddy) current in the metal (e.g., by current robbing), provided Z2 is small enough. A small R2 (e.g., high Q) in the compensating loop and a large M12 (mutual inductance between reader and resonant compensating loop) also reduces the current in the metal layer.

As a result, the resonant compensating loop 320 robs, reduces or removes current from the metal object. The effect increases as the R3/R2 is increased (i.e., the Q-factor of the resonant compensating loop is increased).

Figure 8A:
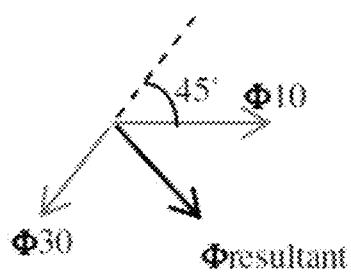
FIGS. 8A-B show a phasor diagram with no compensating coil and a phasor diagram with a compensating coil, respectively.
Figure 8B:
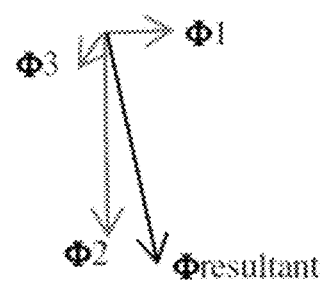

FIG. 8A shows a phasor diagram with no compensating coil, and FIG. 8B shows a phasor diagram with a compensating coil (see 320 of FIG. 7), in which M23=0 and a resonance condition exists in the resonant compensating loop as determined by the following equations:

$$I30=I10\cdot(j\omega M13)/R3(1+j) \quad (7)$$

$$I3=I1\cdot(j\omega M13)/R3(1+j) \quad (8)$$

$$I2=I1\cdot(j\omega M12)/R2 \quad (9)$$

where I10 equals the current through the reader loop (e.g., loop 1) in the absence of the resonant compensating loop. Flux $\Phi^*$ is generated by a current component I*. The direction of I2 and I3 of FIG. 7 are in flux opposition to I1 and are considered in the phasor diagrams of FIGS. 8A-B.

The phasor diagrams of FIGS. 8A-B indicate that while reduction of flux occurs in the presence of metal, the effect is counteracted with a resonant compensating loop (see 230 of FIG. 6 and 320 of FIG. 7). The metal alone creates a reflected negative reactance that tends to be counterbalanced by the positive reactance from the compensating loop.

For illustration purposes, a preliminary circuit simulation can form a basis for the actual design of the present NFC device and some initial parameters thereof, even when the accuracy of the preliminary circuit simulation is not optimized or is less than perfect. For example, the circuit of FIG. 7 was numerically solved using Advanced Design System (ADS) software (available from Agilent Technologies, Santa Clara, Calif.) to remove restrictions such as M23=0 and incorporate the effect of the tag (not shown in FIG. 7).

FIG. 9 shows a conceptual view of an exemplary reader-tag system 400, including a tag 440 and a reader 410 with an antenna 430 on a dielectric substrate (not shown) and a resonant compensating coil 420 on an opposite surface of the dielectric substrate. The reader antenna 430 is close to a metal surface (e.g., a metal shelf or metallic housing/parts in a hand-held device) 450. The equivalent circuit parameters stated below represent the metal surface 450 in proximity to the reader 410, which reads the tag 440 at a predetermined distance, as shown in FIG. 9. Therefore, coupling coefficients of the tag 440 to other elements are relatively small. The metal surface 450 may be part of the reader hardware (e.g., housing circuitry therein). Antenna 430 may be spaced from the metal shelf 450 by a dielectric layer, such as a spacer or other dielectric material on the shelf 450 and/or supporting the antenna 430. The resonant compensating loop 420 may be spaced from the antenna 430 by another dielectric layer of the same or different material(s). Typically, the tag 440 is physically separated from the reader 410.

The typical circuit elements (FIG. 7) include the reader 410 (FIG. 9), in which R0=6Ω, R1=1Ω, C1=450 pF, and L1=300 nH resonating at 13.7 MHz and the excitation voltage thereof=1V. The metal sheet 450 parameters include L3=60 nH (the reactance at 13.56 MHz is approximately 5Ω), and R3=5Ω. In addition, the resonant compensating loop 420 has parameters of L2=300 nH and R2=1Ω; C2 is variable. The tag 440 (FIG. 9) is represented by a series resonant circuit with the following parameters: L=2700 nH, C=51 pF, and R=5Ω. Furthermore, the coupling coefficients (k) between various components of the circuitry include a tag-reader coupling coefficient of 0.025, a tag-metal coupling coefficient of 0.0125, a tag-compensating loop coupling coefficient of 0.035, a reader-compensating loop coupling coefficient of 0.6, a reader-metal coupling coefficient of 0.6, and a compensating loop-metal coupling coefficient of 0.2.

Figure 10A:
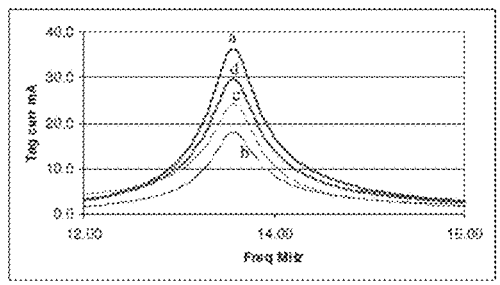
FIGS. 10A-E show currents in the equivalent circuitry of the NFC device as a function of frequency under various conditions.

FIG. 10A shows the tag current as a function of frequency. Curve 'a' refers to a system without the metal shelf, having a peak current at 36 mA. Introduction of metal (see curve 'b' in FIG. 10A) reduces the peak current to 18 mA. Introduction of the compensating loop (e.g., 420 in FIG. 9) resonant at 13.7 MHz (see curve 'c') restores the current back to 24 mA. However, tuning the resonant compensating loop to a higher frequency (18.4 MHz) maximizes the current to 30 mA (see curve 'd'). Generally, the Q of the tag (e.g., 440 in FIG. 9) is much higher than the reader antenna (e.g., 430 in FIG. 9), and therefore the frequency response of the tag samples that of the reader antenna (e.g., 430 in FIG. 9).

Figure 10B:
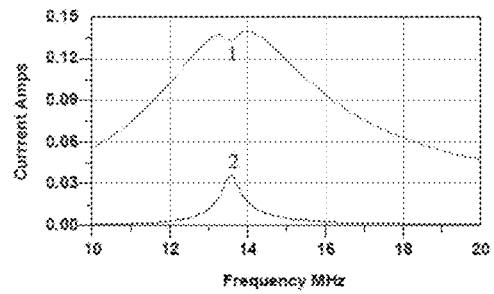
Figure 10C:
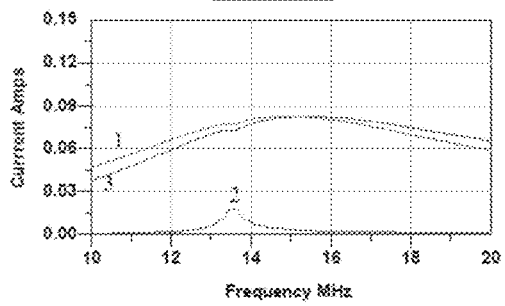
Figure 10D:
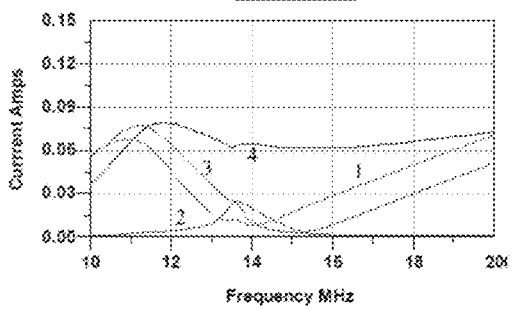
Figure 10E:
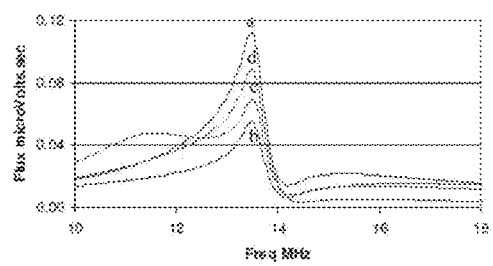

FIG. 10B shows the reader current (see curve 1) and the tag current (see curve 2) without the presence of the metal shelf. Introduction of metal, as shown in FIG. 10C, reduces the reader and tag currents (see curves 1 and 2) and gives rise to a metal current (see curve 3). The peak frequency of the reader current moves up to approximately 15 MHz from 13.6 MHz (compare FIG. 10C with FIG. 10B), due to cancellation of flux by the metal surface current. FIG. 10D shows the effect of a resonant compensating loop (e.g., 420 in FIG. 9) tuned to 13.7 MHz (e.g., where C2=450 pF), whereby the compensating loop (see curve 4 in FIG. 10D) has "robbed" or removed some or all of the current from the metal shelf (see curve 3), and increased the tag current (see curve 2) as compared to FIG. 10C. FIG. 10E depicts the resultant magnetic flux from all elements, such as the reader antenna 430, the tag 440, the metal shelf 450, and the compensating loop 420. The curves a, b, c and d in FIG. 10E signify the same conditions as in FIG. 10A.

The equivalent circuit model (e.g., 310 in FIG. 7) is merely an approximation, since many parameters for the circuit elements are rough estimates. Notable among these are R3, L3 (of the metal object), and the coupling coefficients among the reader, the metal, and the resonant compensating loop. Furthermore, R3 and L3 have a frequency dependence that is not considered in this example. More extensive measurements and/or field simulations may improve the accuracy in determining such parameters. Also, the above discussion is limited to the condition where the metal object is close to the reader antenna, as shown in FIG. 9, which may result in a low coupling coefficient between the tag and other elements. Such restrictions are removed in the field simulation discussed below.

Formulas (5) and (6) above indicate that current robbing or removal becomes more effective as the mutual inductance (M12) between the reader and the resonant compensating loop 420 increases, a relationship that is validated from the above circuit simulation. Therefore, in the full-wave field simulation, the resonant compensating loop and the reader antenna have identical geometries (see FIG. 11), and the resonant compensating loop may be positioned directly over the reader antenna.

Figure 11:
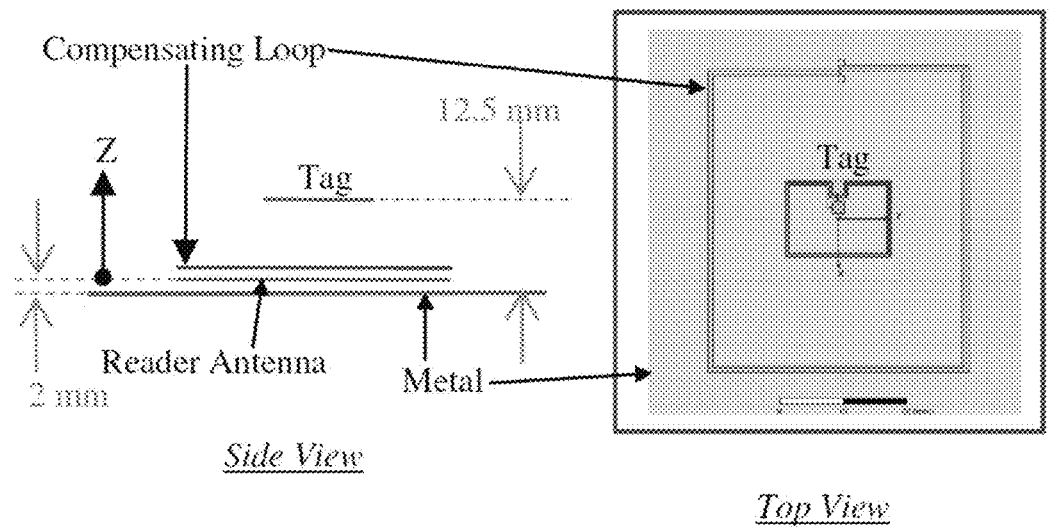
FIG. 11 respectively shows a side view and a top view of an exemplary near field communication device according to the present invention.

FIG. 11 shows the geometry or spatial relationships between the various system elements for the full-wave field simulation. The origin of the Z-axis is at the plane of the reader antenna. For example, the reader antenna is 2 mm above the metal surface, the compensating loop is spaced a certain distance above the reader antenna, and the tag is 12.5 mm above the reader antenna. In this example, the Z position of the compensating loop was varied from 0.5 mm to 2.9 mm above the reader antenna. The dimensions of the metal object (e.g., a stainless steel sheet) are 98 mm×84 mm×0.5 mm, and the Z position of the metal object is −2 mm relative to the horizontal position of the antenna In the example of FIG. 11, the dimensions of the reader antenna are 42 mm×48 mm, having 2 turns, a nominal inductance at 610 nH, and a Z position at 0 mm. Conventional software for simulating 3-D full-wave electromagnetic fields (e.g., HFSS software obtained from ANSYS, Inc., Canonsburg, Pa.) was used to numerically solve the geometry of the circuitry in FIG. 11.

The resonant compensating loop may have the same or different geometry as the reader (reader/tag) antenna. However, in the simulation/example of FIG. 11, the compensating loop had identical dimensions as the reader antenna (42 mm×48 mm, and two turns). Also, in the simulation, the resonant compensating loop included a variable external capacitor and a 50 KΩ resistor in parallel with the capacitor. Although the shape of the resonant compensating loop, by itself, may have relatively minimal effect on the shielding, a resonant compensating loop having the same or substantially similar size and/or number of turns and/or loops as the antenna advantageously increases the shielding performance of the resonant compensating loop. While the dimensions of the resonant compensating loop are not particularly limited (except perhaps by the dimensions of the device containing the tag antenna), in some embodiments, the length and width of the compensating loop may have upper and lower limits that are an integer or multiple fraction (e.g., n times or 1/n times, where n is an integer) of the length and width of the antenna, respectively. Thus, the resonant compensating loop may have a length and/or width (preferably both) that is from 0.25 to 4 times the respective length and/or width of the antenna (e.g., 0.33 to 3 times, 0.5 to 2 times, or any value or range of values therein). Also, the number of turns or loops of the resonant compensating loop may have upper and lower limits that are an integer or multiple fraction (e.g., m times or 1/m times, where m is an integer) of the number of turns or loops of the antenna, where n is an integer. Thus, the resonant compensating loop may have number of turns or loops that is from 0.25 to 4 times the number of turns or loops of the antenna (e.g., 0.33 to 3 times, 0.5 to 2 times, or any value or range of values therein). Also, the ratio of the number of turns or loops of the resonant compensating loop to the number of turns or loops of the antenna may be independent of the ratio of the length and/or width of the resonant compensating loop to the length or width of the antenna.

In the example of FIG. 11, the antenna of the tag has dimensions of 12 mm×17 mm, and 4 turns resulting in an inductance of 600 nH located at the Z position of 12.5 mm, and the tag has an external capacitor with a capacitance of 220 pF to resonate at ~13.7 MHz and a 50 KΩ resistor in parallel with the external capacitor to emulate the effect of loading by the chip. Thus, the antenna and the resonant compensating loop may have the same or substantially similar size and the same number or an integer multiple or fraction of the number of turns and/or loops. However, the antenna may have a length and a width of from 1 to 100 mm, or any value or range of values therein. The width may be independent of the length. Also, the antenna may have any number of turns or loops, for example from 1 to 100 (e.g., 1, 2, 3, 4, 6, 10, 20, 50, etc.), or any other value or range of values therein). The antenna may also have an inductance of from 0.01 nH to 500 μH, or any value or range of values therein. In addition, the external capacitor may have a capacitance from 1 pF to 100,000 pF (e.g., 10-10,000 pF. 20-1,000 pF, 50-500 pF, or any other value or range of values therein). Also, the resistor may have a resistance from 0.1 to 5000 kΩ (e.g., 1-500 kΩ, 10-100, kΩ, or any other value or range of values therein).

Figure 12A:
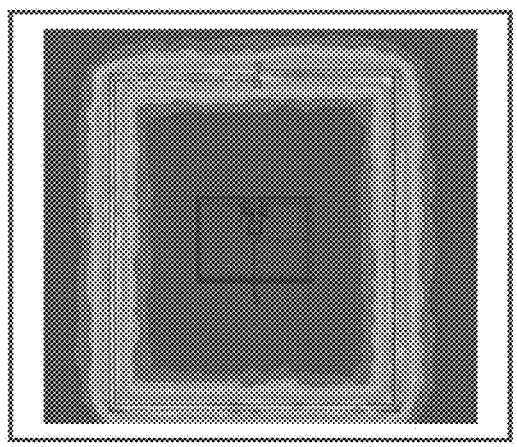
Figure 12B:
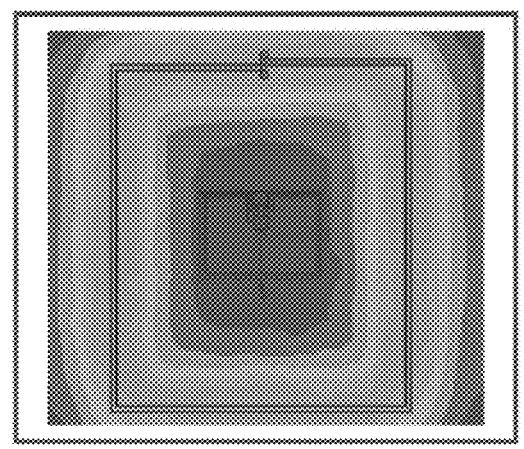

FIGS. 12A-13B depict a peak surface current density and a peak magnetic field, respectively, without the resonant compensating loop (FIGS. 12A and 13A) and with the resonant compensating loop (FIGS. 12B and 13B). The magnitude of surface current on the metal (e.g., z equals −2 mm) is plotted and color coded, in which red has the strongest magnitude of surface current, and blue has the weakest magnitude of surface current. Although the tag in FIGS. 12A-B is red, the color of the tag depicted in FIGS. 12A-B does not represent the magnitude of the surface current. The magnetic field (also color coded as previously discussed) is shown in the YZ plane. The plots demonstrate the effectiveness of the resonant compensating loop to rob or remove the current from the metal and increase the magnetic field. A complex conjugate match was ensured at the input of the reader antenna under various scenarios of simulation. Also, the power dissipated by the reader antenna may be maintained at an approximately constant 50 mW by adjusting the excitation voltage.

The phase angle between the peak surface current without the resonant compensating loop and the reader current (FIG. 12A) was 135°. This result correlates with the phasor diagram of FIG. 8A. In other words, the phase angle between the reader and the surface (eddy) current in the metal object was 135°.

The power gain (loss) Gp at a resonance (i.e., for Im [Zin]=0) is generally the Figure of Merit of the system and is defined using the equivalent network of FIG. 14. The power gain (Gp) may be determined by dividing the power dissipated at the load by the power available from the source. As a result, Gp may be determined by the following equation:

$$Gp = \frac{\frac{|I1|^2 \cdot |z21|^2}{RL}}{|I1|^2 \cdot Rin} = \frac{|z21|^2}{RL \cdot Rin} \qquad (9)$$

where RL equals the load resistor in the tag representing chip dissipation, and Rin equals Re(Zin). If the chip in the tag is powered up, the tag-to-reader information transferred in the form of load modulation is usually successful and this justifies the use of the power gain as the Figure of Merit for a successful tag operation. Since RL stays fixed under different configurations of the reader antenna, the resonant compensating loop and the metal layer, a normalized power gain without RL may be used.

The capacitor in the compensation loop may be varied, and the gap between the reader antenna and the compensation loop may be another variable parameter. For example, the antenna and the resonant compensating loop may be positioned a predetermined distance apart and/or a predetermined minimum distance away from the metal object. For example, the distance between the compensating loop and the antenna may be 0.5 to 20 mm (e.g., 2, 4, 6, 8 mm, or any other value or range of values therein). Preferably, the distance between the compensating loop and the antenna is between 0.5 mm and 5 mm. Furthermore, the distance between the antenna and the metal object may be at least 0.2 mm (e.g., 1, 2, 3, 4 mm, or more). Preferably, the distance between the antenna and the metal object is at least 2 mm. Also, the distance between the compensating loop and the metal object may be at least 0.4 mm (e.g., 2, 4, 6, 8, 10, 12, 14, 16 mm, or more). Preferably, the distance between the compensating loop and the metal object is at least 2.5 mm.

Figure 15:
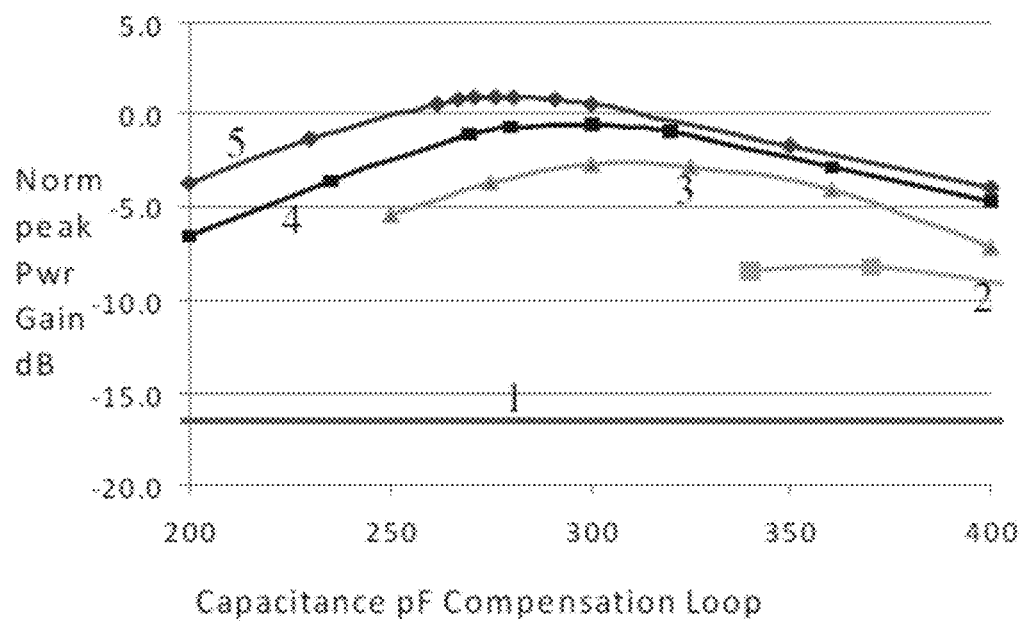
FIG. 15 shows a normalized power gain of a reader-tag system employing the present invention in an EM simulation under various conditions.

The source impedance (e.g., at the reader) was set at 50Ω, unlike the complex conjugate matched situation for FIGS. 12A-13B, as equation (9) was used to calculate the power gain from z21 and Re(z11). RL is constant, and therefore, is factored out during normalization. Normalized power gain (i.e., normalized with respect to power gain for the absence of a metal object) is plotted in FIG. 15. Curve 1 refers to the situation without a compensation loop, while curves 2-5 refer to the compensation loop placed at various distances, such as, 0.5 mm, 1.9 mm, 2.9 mm, and 3.9 mm, respectively) from the reader antenna. The distance or spacing between the compensating loop and the antenna is in general a function of the shielding performance (e.g., for compensating loops and antennas having the same or substantially the same size and number of loops). As the distance or spacing increases, the performance of the shielding advantageously improves. As a result, using the present compensating loop, it is possible to compensate, and even exceed, the performance of the same reader and tag in the absence of the metal object.

Experiments Using Exemplary Near Field Communication Devices

Figure 16:
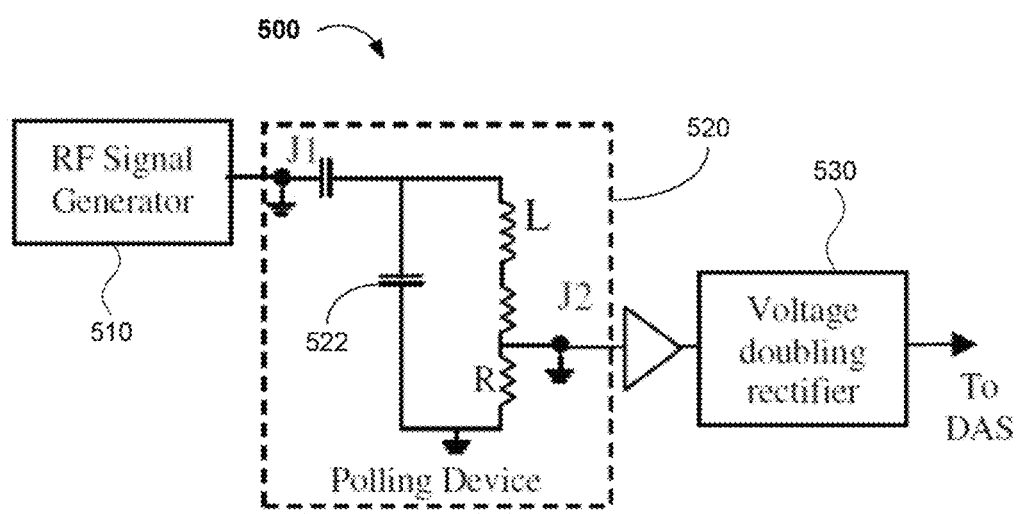
FIG. 16 illustrates an exemplary setup with a reader antenna according to embodiments of the present invention.

FIG. 16 shows a system 500 for demonstrating the effect of metal on or relatively close to a reader antenna, using a polling device standard reader antenna as specified by the NFC Forum. The five turn reader antenna, with dimensions 47 mm×32 mm, printed on a 1.5 mm thick FR4 board, is represented by L in FIG. 16. The board also contains a capacitive matching network to the present 50Ω input impedance at connector J1, as well as an external 1Ω resistor R to monitor the antenna current at connector J2. The RF signal generator 510 is set at 13.56 MHz and generates a magnetic field of approximately 7.5 A/m at 5 mm distance from the antenna in the Z-direction. The connector J2 may be used to monitor load modulation induced by the presence of a tag. The signal at J2 may be amplified, rectified and fed to a 20 megasamples/second (Ms/s) data acquisition system (DAS). A copper sheet was placed at Z=approximately −2.3 mm as the disturbing element. The resonant compensating loop, to mitigate the effect of the copper sheet, consisted of a six turn rectangular loop having outer dimensions of 42 mm×42 mm with copper traces printed on a polyester (PET)

board and a 47 picofarad (pF) 0603 capacitor (not shown). The resonant compensating loop resonates at 13.3 MHz with Q=36 and is placed at Z=approximately 0.5 mm. An ISO 14443 variant tag may be placed at Z=approximately 5 mm (not shown).

Figure 17:
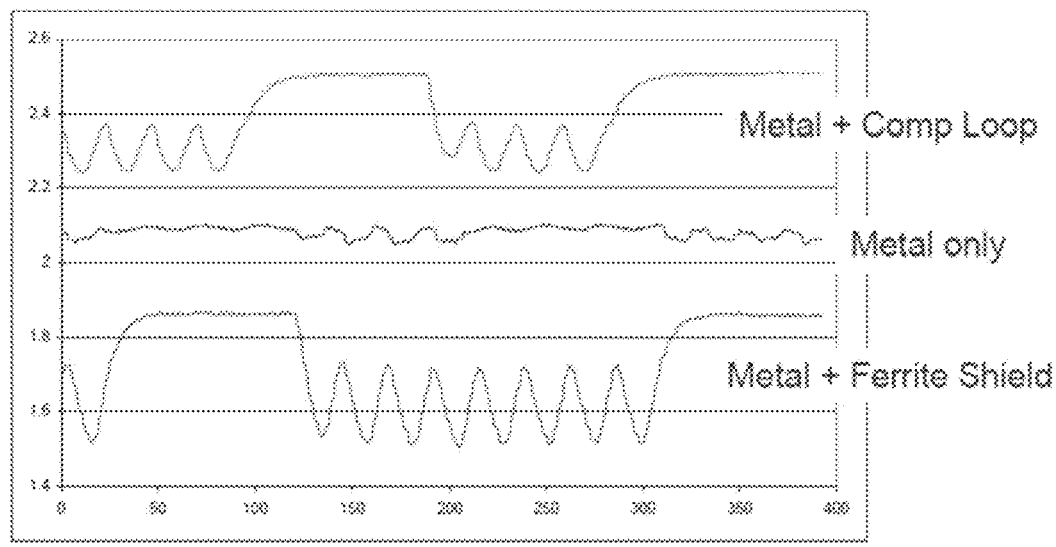
FIG. 17 shows various exemplary time domain waveforms representing load modulation when the device with the antenna functions as a reader.

FIG. 17 shows the time domain waveforms that represent an envelope of load modulation when the antenna functions as a reader. The middle waveform represents a device without any compensation, and the top waveform corresponds to a device using a resonant compensating loop. For comparison, the bottom waveform was generated using a ferrite shield. The ferrite material (e.g., 0.1 mm thick FK03 from NEC Tokin) was attached directly to the metal layer (e.g., copper sheet), while keeping the rest of the system the same. The copper sheet was positioned 1.6 mm below the reader antenna, and the tag was 5 mm above the reader antenna. The waveforms may be synchronized during measurement; otherwise, data acquisition may start at random time intervals, as shown in FIG. 17. Also, suitable offsets may be added to display the waveforms conveniently using the same scale. The results in FIG. 17 demonstrate that the resonant compensating loop performs comparably to the ferrite shield material with regard to mitigating the effect of metal.

Another experiment was carried out for large antennas (e.g., 450 mm×150 mm) on metal shelves. To read multiple ISO 15693 tags with such an antenna, a spacer having a height of approximately 45 mm is necessary between the antenna and the metal shelf. Adding a resonant compensating loop reduced the spacer thickness by more than a factor of two.

Figure 18:
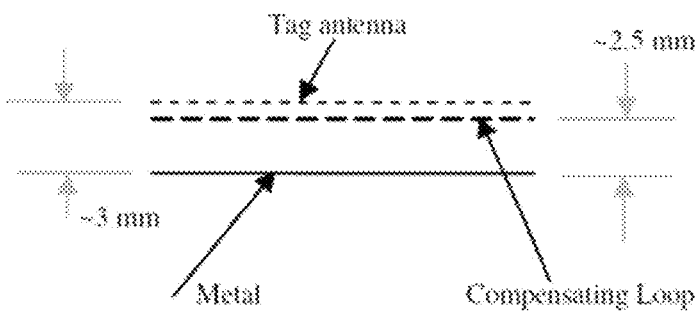
FIG. 18 shows an exemplary tag according to the present invention in typical proximity to a metal object.

While the simulations focused on the metal object (e.g., a shelf or housing) in proximity to the reader antenna, an experiment was also performed with the metal object near the tag. For this, a near field or proximity reader obtained from Farpointe Data, Inc. (Sunnyvale, Calif.) was used to read an ISO 14443 variant tag at a distance of 42.5 mm, with the magnetic field less than 2 A/m. Due to proximity of the copper sheet to the tag, a spacer was placed between the tag and the metal sheet to provide the same read distance. Without a resonant compensating loop, a credit card-sized tag (76 mm×44 mm) may be read in the presence of a metal object, such as a metal sheet, provided a gap of approximately 7 mm was maintained between the tag and the metal sheet. With a resonant compensating loop added, the gap may be reduced to less than 3 mm, as shown in FIG. 18.

Figure 19:
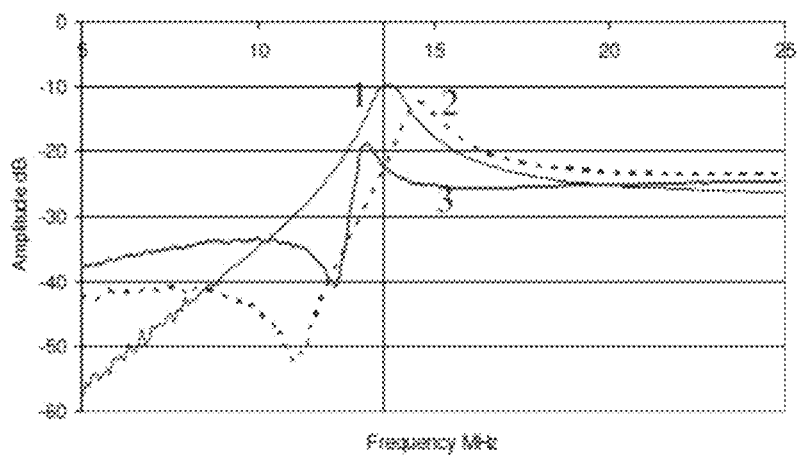
FIG. 19 shows resonant characteristics of exemplary tags according to the present invention.

FIG. 19 displays the overall resonance behavior of a tag under different conditions, based on S11 (which represents how much power is reflected from an antenna) measurements made with an 8753ES Vector Network Analyzer (VNA; available from Agilent Technologies, Santa Clara, Calif.) and a single-turn sensing coil with a diameter of approximately 64 mm. The data corresponding to the sensing coil alone was stored in memory, and a Data-Memory operation was used to generate the resonant characteristics of the sensing coil. The vertical line corresponds to the operating frequency of the reader at 13.56 MHz. Curve 1 corresponds to the stand-alone tag displaying a resonance close to 13.56 MHz. Curve 2 corresponds to a tag with metal backing, with a spacer of 7 mm between the backing and the tag, but without a resonant compensating loop. Even with a 7 mm gap, the resonant frequency is significantly higher than 13.56 MHz, and the tag is under-compensated. Increasing the spacer thickness substantially brings the resonance peak close to 13.56 MHz. Curve 3 corresponds to the tag with a resonant compensating loop, as shown in FIG. 18 and described herein. The configuration is slightly overcompensated, in that the resonance peak is below 13.56 MHz. A reduction in both bandwidth and effective coupling (as indicated by the peak amplitude) may be a result of such overcompensation and/or introduction of additional zeros.

The effect of the resonant compensating loop may be enhanced by increasing the Q. Such efforts have been made for wireless power transfer applications. For transponders, however, the Q cannot be increased indefinitely due to the finite bandwidth required for transmission of load modulation information.

Generally, use of equivalent circuits is the most convenient way to develop design equations for optimizing the reader-tag system and parameters thereof (e.g., including those of the compensating loop), and therefore further refinement in topology, as well as component or parameter values, is possible. Additional detailed phasor diagrams may provide a clearer insight into reader-antenna-compensating loop interactions. The model developed herein may be general enough to represent the effect of metal objects (e.g., shelves, housing, casing, metal foil backing on a tag, etc.) in proximity to either the reader or the tag.

Figure 3:
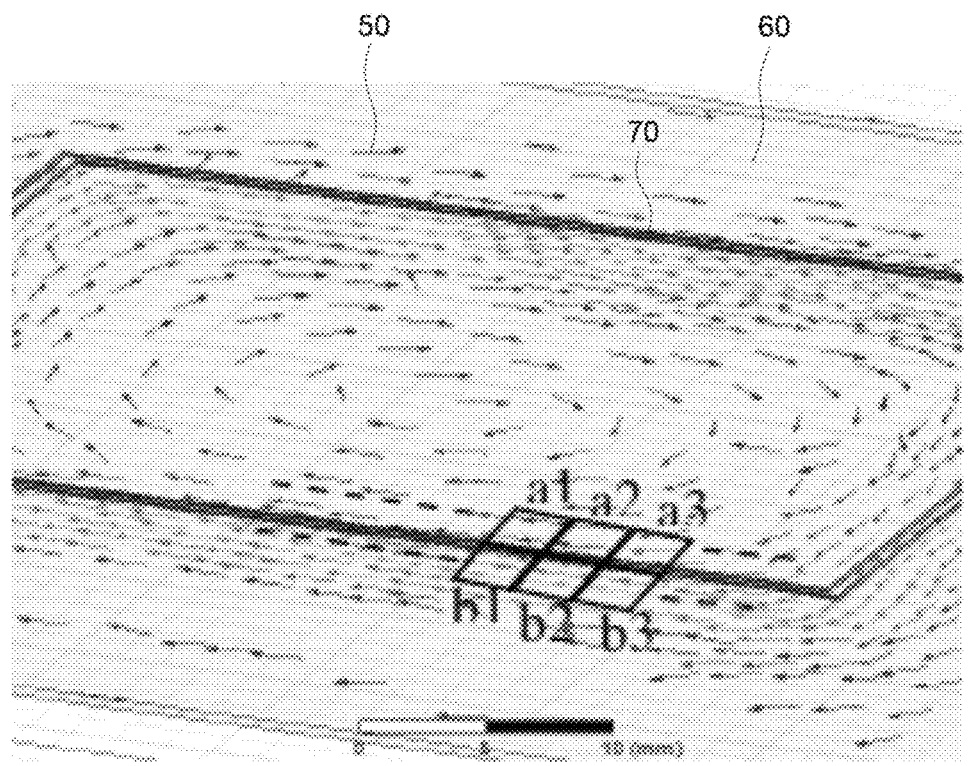
FIG. 3 shows surface (eddy) currents on a metal sheet or layer and illustrates the use of squares along the direction of a current loop to estimate loop impedance of a sheet.
Figure 4:
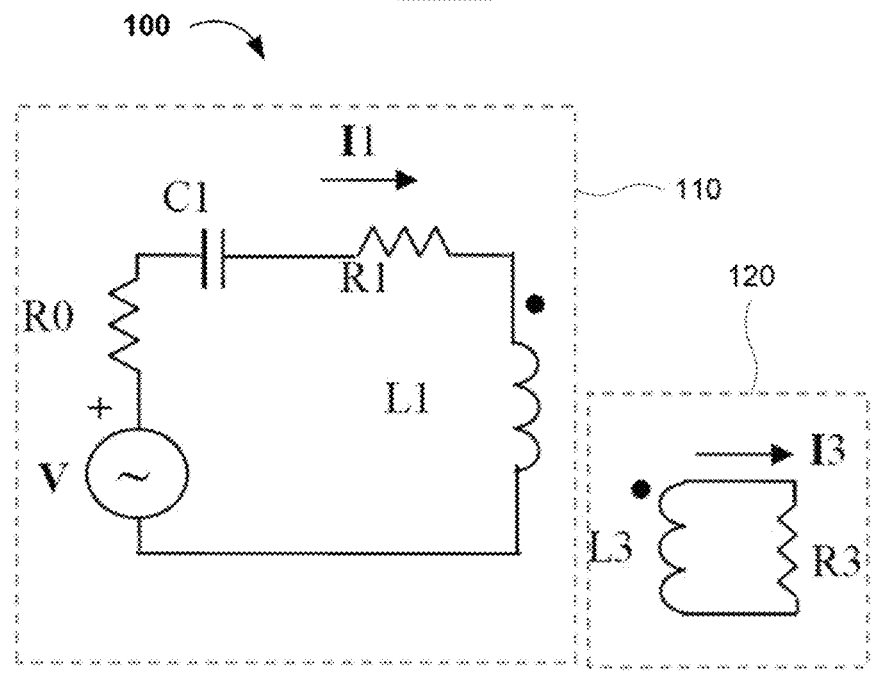
FIG. 4 is diagram showing an equivalent circuit for a conventional near field communication device in proximity to a metal object.
Figure 5:
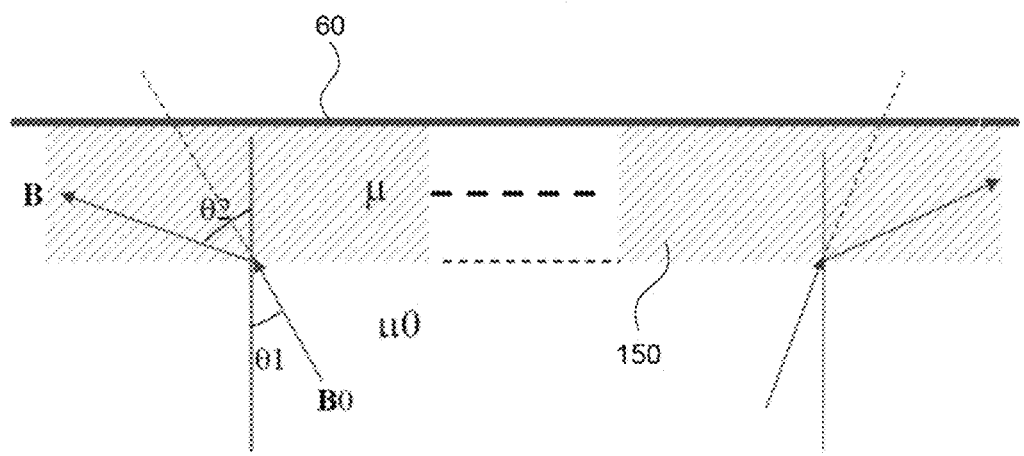
FIG. 5 shows the change in direction of magnetic flux in the presence of a ferrite shield.

Addition of a resonant compensating loop in close proximity to another resonant circuit (e.g., a tag or reader antenna) initiates separation of the resonance peaks. By maintaining a minimum physical separation between the two resonant circuits, the coupling coefficient is kept sufficiently low that the resonance peaks are not separated by an amount that adversely affects the read operation. It may be possible to reduce this physical separation and maintain the resonant frequency peaks within acceptable limits by utilizing various geometries of the resonant compensating loop. This may allow for construction or manufacture of thinner tags, or reduction of spacer heights for reader antennas The model for surface (eddy) currents, as discussed above with reference to FIG. 3, is an approximation that uses an average value of loop impedance. In reality, multiple concentric loops with finite coupling among each of the loops may be considered, especially loops that have slightly different voltages induced in each loop. The effect of a non-uniform field may play a role, especially for loops with large dimensions, as the field tends to decrease in a transverse direction. The present model may not be as accurate as desired when predicting the reduction of flux for very high values of coupling between the tag and reader antennas, but is still useful in typical cases.

The experimental results herein provide support for the present invention, particularly in consideration of load modulation. However, additional experiments and simulation with emphasis on bandwidth and waveform integrity in the time domain may be beneficial. In addition, the spacing between the various elements and/or layers (e.g., the antenna and compensating loop) may be varied for optimization. The resonant frequency may also vary within certain or acceptable limits.

An Exemplary Method of Manufacturing a Near Field Communication Device

FIG. 20 is a flow chart shows an exemplary method 600 of manufacturing a near field communication device.

At 610, the dielectric substrate is formed. In one or more embodiments, the substrate comprises or consists of a plastic, and the substrate is formed by injection molding. At 620, an antenna is formed on the dielectric substrate. The antenna may be configured to receive a first near field signal (e.g., at a first frequency) and/or to transmit or broadcast a second near field signal (e.g., at a second frequency the same as or different from the first frequency). In general, the antenna is attached to circuitry that includes a demodulator and/or a modulator. Forming the antenna may include depositing a metal layer on the surface of the dielectric substrate, and subsequently patterning (e.g., by photolithography) and etching the metal layer. Alternatively, the antenna may be formed by printing a metal coil or ring on the dielectric substrate. The antenna may have a thickness of 0.01-2 mm, or any thickness or range of thicknesses therein.

At 630, a dielectric layer may be formed on or over the antenna. The dielectric layer may comprise or consist of a dielectric material as described herein. At 640, a resonant compensating loop is formed over or near the antenna (e.g., on the dielectric layer), such that the resonant compensating loop is electromagnetically coupled to the antenna, and the resonant compensating loop mitigates or counteracts an electromagnetic effect of a metal object on or near a surface of the dielectric substrate opposite from the antenna. Forming the resonant compensating loop may include depositing a second metal layer on the dielectric layer, then patterning and etching the second metal layer. The compensating loop may be formed in a sheet or ring pattern. In one example, the dielectric layer comprises or consists of a polyester (PET) layer, and the compensating loop may be formed thereon. A capacitor (e.g., having a capacitance in the range of 1-1000 picofarads [pF]) coupled or electrically connected to the compensating loop may be formed at the same time as the compensating loop. Alternatively, the resonant compensating loop may be formed by printing a metal coil or ring on the dielectric layer. The compensating loop may be magnetically or inductively coupled to the antenna.

Alternatively (not shown in FIG. 20), the compensating loop may be formed between the dielectric substrate and the antenna. In such embodiments, forming the compensating loop may include depositing a first metal layer on or over the dielectric substrate, then patterning and/or etching the first metal layer. In another example, forming the compensating loop may include printing a metal coil or ring on the dielectric substrate. A dielectric layer may be formed on the compensating loop before the antenna is formed. Forming the antenna may include depositing a second metal layer on the dielectric layer, then patterning and etching the second metal layer, or printing a metal coil or ring on the dielectric layer.

At 650, regardless of whether the antenna is between the substrate and the compensating loop or whether the compensating loop is between the substrate and the antenna, the antenna and compensating loop are coupled to circuitry in a near field communication (NFC) device that includes a modulator and/or demodulator. The circuitry in the NFC device may further include rectifier (e.g., coupled or connected to the antenna), a clock generator and/or recovery circuit (e.g., configured to receive a demodulated signal from the demodulator), a memory configured to store and/or output data (e.g., an identification code or number), a sensor, a battery, etc.

An Exemplary Method of Monitoring a Semiconductor Manufacturing Process

The present invention may be useful to mitigate the effect(s) of metal content in semiconductor wafers during contactless transfer of physical parameter information during semiconductor manufacturing. Thus, the present invention also relates to a method of monitoring at least one physical parameter of a semiconductor manufacturing process, comprising monitoring the semiconductor process using a monitor configured to monitor the semiconductor process, wirelessly transmitting data or information from the monitor, and wirelessly reading the data or information with a reader configured to receive the data or information from the monitor. The monitor and/or reader may include the present near field communication device. Monitoring the semiconductor process may include monitoring physical parameters during a process in which metal content on the semiconductor wafer may shield the transmission of data from the monitor and/or reception of the data by the reader. For example, the process may include a chemical-mechanical polishing (CMP) process, and the physical parameters may include a temperature of the semiconductor wafer, an amount of material removed during polishing, etc. Thus, the present near field communication device may advantageously sense and/or report physical parameters (e.g., temperature and/or removal of material) during the CMP polishing process. Thus, the metal content in semiconductor wafers which may have a deleterious effect on near-field communications of process data and/or information may be advantageously mitigated.

CONCLUSION/SUMMARY

The present invention provides a near field communication device that advantageously mitigates adverse effects from proximity of a metal object using a resonant compensating loop. The present near field communication device "robs," reduces or removes induced current from the metal object to mitigate the reduction of the magnetic flux of the field from the antenna, minimizing deterioration of operations of the near field communication device, and avoiding the use of expensive ferrite shielding. The present device including a resonant compensating loop may advantageously be constructed using same process technology and materials as the antenna coil (e.g., etched or printed metal on a PCB, dielectric sheet or other substrate), resulting in a relatively cost effective and highly functional near field communication device (e.g., reader and/or tag applications).

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application. It is intended that the scope of the invention be defined by the claims appended hereto and their equivalents.

What is claimed is:

1. A near field communication device, comprising:
   a) a receiver configured to convert a first near field signal to an electric signal;
   b) a transmitter configured to generate a second near field signal;
   c) a dielectric substrate within a housing;
   d) an antenna on or over said dielectric substrate, said antenna receiving said first near field signal, transmitting or broadcasting said second near field signal, and generating a flux;
   e) an insulating or dielectric layer on or over said antenna; and
   f) a resonant compensating loop within said housing and coupled to said antenna, said resonant compensating loop (i) being on an opposite side of said insulating or dielectric layer from said antenna and (ii) having at least two turns or loops, wherein a current in the resonant compensating loop has a direction that aids the flux generated by the antenna.

2. The device of claim 1, wherein said antenna is between said dielectric substrate and said resonant compensating loop.

3. The device of claim 1, wherein said dielectric substrate comprises fiberglass, epoxy, silicon dioxide, silicon nitride, silicon oxynitride, aluminum oxide, tantalum oxide, zirconium oxide, a polysiloxane, parylene, polyethylene, polypropylene, an undoped polyimide, a polycarbonate, a polyamide, a polyether, a copolymer thereof, or a fluorinated derivative thereof.

4. The device of claim 1, wherein said antenna comprises a radio frequency (RF) antenna, and said resonant compensating loop resonates at a frequency at or near that of the antenna.

5. The device of claim 1, wherein each of said antenna and said resonant compensating loop comprises an electrically conducting coil.

6. The device of claim 1, wherein said resonant compensating loop is magnetically or inductively coupled to said antenna.

7. The device of claim 1, wherein said resonant compensating loop mitigates or counteracts an electromagnetic effect of metal on or near a surface of said dielectric substrate opposite from said antenna.

8. The device of claim 1, wherein said resonant compensating loop is between said dielectric substrate and said antenna.

9. The near field communication device of claim 1, wherein a distance between the antenna and the resonant compensating loop is from 0.5 to 20 mm.

10. The near field communication device of claim 1, wherein the dielectric substrate has a thickness of from 1 to 5 mm.

11. The near field communication device of claim 1, wherein said antenna has a first length, a first width and a first number of turns or loops, and said resonant compensating loop has a second length, a second width and a second number of turns or loops, said second length being from 0.5 to 2 times said first length, said second width being from 0.5 to 2 times said first width, and said second number of turns or loops being from 0.25 to 4 times the first number of turns or loops.

12. A method of manufacturing a near field communication device, comprising:
   a) forming an antenna on a dielectric substrate or on an insulating or dielectric layer, said antenna receiving a first near field signal and transmitting or broadcasting a second near field signal, and coupled to a receiver and a transmitter, said antenna generating a flux;
   b) forming a resonant compensating loop configured to be electromagnetically coupled to said antenna, that mitigates or counteracts an electromagnetic effect of metal on or near a surface of said dielectric substrate, said resonant compensating loop having at least two turns or loops, wherein a current in the resonant compensating loop has a direction that aids the flux generated by the antenna; and
   c) placing and/or forming said antenna, said dielectric substrate, said insulating or dielectric layer, and said compensating loop in a housing of the near field communication device such that said resonant compensating loop is on an opposite side of said insulating or dielectric layer from said antenna.

13. The method of claim 12, wherein said antenna is between said dielectric substrate and said resonant compensating loop.

14. The method of claim 12, further comprising forming said dielectric substrate.

15. The method of claim 13, wherein said dielectric substrate comprises fiberglass/epoxy, silicon dioxide, silicon nitride, silicon oxynitride, aluminum oxide, tantalum oxide, zirconium oxide, a polysiloxane, parylene, polyethylene, polypropylene, an undoped polyimide, a polycarbonate, a polyamide, a polyether, a copolymer thereof, or a fluorinated derivative thereof.

16. The method of claim 12, wherein forming said antenna comprises depositing a first metal layer on said first surface of said dielectric substrate, then patterning and etching said first metal layer.

17. The method of claim 12, wherein forming said antenna comprises printing a metal coil or ring on said dielectric substrate.

18. The method of claim 17, wherein said metal coil or ring comprises a copper coil or ring.

19. The method of claim 12, further comprising forming a dielectric layer on said antenna, before forming said resonant compensating loop.

20. The method of claim 19, wherein forming said resonant compensating loop comprises depositing a second metal layer on said dielectric layer, then patterning and etching said second metal layer.

21. The method of claim 19, wherein forming said resonant compensating loop comprises printing a metal coil or ring on said dielectric layer.

22. The method of claim 19, wherein forming said resonant compensating loop comprises (i) depositing a first metal layer on or over said dielectric substrate, then patterning and etching said first metal layer, or (ii) printing a metal coil or ring on said dielectric substrate.

23. The method of claim 22, further comprising forming a dielectric layer on said resonant compensating loop, before forming said antenna.

24. The method of claim 19, wherein said resonant compensating loop is magnetically or inductively coupled to said antenna.

25. The method of claim 12, wherein a distance between the antenna and the resonant compensating loop is from 0.5 to 20 mm.

26. The method of claim 12, wherein said antenna has a first length, a first width and a first number of turns or loops, and said resonant compensating loop has a second length, a second width and a second number of turns or loops, said second length being from 0.5 to 2 times said first length, said second width being from 0.5 to 2 times said first width, and said second number of turns or loops being from 0.25 to 4 times the first number of turns or loops.

27. A method of monitoring at least one parameter of a semiconductor manufacturing process, comprising:
   a) conducting the semiconductor manufacturing process;
   b) monitoring one or more physical parameters of the semiconductor process; and
   c) transmitting data or information from a monitor configured to monitor the semiconductor process, and reading the data or information with a reader configured to receive the data or information from the monitor,
   wherein the monitor and/or reader comprises a near field communication device comprising:
      a receiver configured to convert a first near field signal to an electric signal;
      a transmitter configured to generate a second near field signal;
      a dielectric substrate within a housing;

an antenna on said dielectric substrate, said antenna receiving said first near field signal and transmitting or broadcasting said second near field signal; and a compensating loop within said housing and coupled to said antenna.

28. The method of claim 27, wherein the semiconductor process comprises a chemical-mechanical (CMP) polishing process.

29. The method of claim 28, wherein the one or more parameters comprises a temperature of a semiconductor wafer and/or an amount of material removed during polishing.

30. A method of manufacturing a near field communication device, comprising:
   a) forming an antenna on a dielectric substrate, said antenna receiving a first near field signal and transmitting or broadcasting a second near field signal, and coupled to a receiver and a transmitter; and
   b) forming a compensating loop configured to be electromagnetically coupled to said antenna and that mitigates or counteracts an electromagnetic effect of metal on or near a surface of said dielectric substrate by a process that comprises (i) depositing a first metal layer on or over said dielectric substrate, then patterning and etching said first metal layer, or (ii) printing a metal coil or ring on said dielectric substrate;
   wherein said dielectric layer is formed on said compensating loop before said antenna is formed, and said antenna, said dielectric substrate and said compensating loop are formed or placed in a housing of the near field communication device.

31. The method of claim 30, wherein forming said antenna comprises (i) depositing a second metal layer on said dielectric layer, then patterning and etching said second metal layer, or (ii) printing a metal coil or ring on said dielectric layer.

* * * * *